United States Patent
Gesche et al.

(10) Patent No.: US 8,324,971 B2
(45) Date of Patent: Dec. 4, 2012

(54) SELF-ADJUSTING GATE BIAS NETWORK FOR FIELD EFFECT TRANSISTORS

(75) Inventors: Roland Gesche, Seligenstadt (DE); Ibrahim M. Khalil, München (DE); Silvio Kuehn, Wandlitz (DE); Armin Liero, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 0 days.

(21) Appl. No.: 13/063,314

(22) PCT Filed: Sep. 15, 2009

(86) PCT No.: PCT/EP2009/061975
§ 371 (c)(1),
(2), (4) Date: Apr. 15, 2011

(87) PCT Pub. No.: WO2010/029186
PCT Pub. Date: Mar. 18, 2010

(65) Prior Publication Data
US 2011/0181324 A1    Jul. 28, 2011

(30) Foreign Application Priority Data
Sep. 15, 2008  (EP) ..................... 08164363

(51) Int. Cl.
*H03F 3/04* (2006.01)
(52) U.S. Cl. ....................... 330/296; 330/285
(58) Field of Classification Search ............... 330/285, 330/296
See application file for complete search history.

(56) References Cited

U.S. PATENT DOCUMENTS

| | | | | |
|---|---|---|---|---|
| 5,670,911 | A * | 9/1997 | Hori et al. | 330/277 |
| 7,265,618 | B1* | 9/2007 | Meck | 330/251 |
| 7,372,334 | B2* | 5/2008 | Blair et al. | 330/302 |
| 7,439,810 | B2* | 10/2008 | Manicone et al. | 330/296 |
| 7,612,616 | B2* | 11/2009 | Deng et al. | 330/302 |
| 7,671,684 | B2* | 3/2010 | Honda et al. | 330/296 |

(Continued)

FOREIGN PATENT DOCUMENTS

DE    39 02 871 A1    8/1990
(Continued)

OTHER PUBLICATIONS

European Search Report Jan. 23, 2009.
(Continued)

*Primary Examiner* — Henry Choe
(74) *Attorney, Agent, or Firm* — Norris McLaughlin & Marcus, P.A.

(57) ABSTRACT

The present invention is directed to a self-adjusting gate bias network for field effect transistors in radio frequency applications. A bias network for field effect transistors is provided comprising a field effect transistor having a source electrode connected to ground and a drain electrode connected to a load; a radio frequency network connected to the gate electrode; a gate bias network connected to the gate electrode; wherein a device having a non-linear characteristic is provided in series between the gate electrode and the gate bias network such that a forward bias current at the gate electrode of the field effect transistor is reduced or prevented.

The reduction or prevention of a forward bias current leads in overdrive conditions to a self-adjustment of the bias point of the field-effect transistor improving the reduction of distortions of an amplifier or changing the class of oscillators connected to the gate electrode.

12 Claims, 15 Drawing Sheets

U.S. PATENT DOCUMENTS

| | | | |
|---|---|---|---|
| 2001/0054927 | A1 | 12/2001 | Zhou et al. |
| 2003/0112054 | A1 | 6/2003 | Yamaguchi |
| 2011/0181324 | A1* | 7/2011 | Gesche et al. ............ 327/109 |

FOREIGN PATENT DOCUMENTS

| | | |
|---|---|---|
| EP | 0 033 198 A | 8/1981 |
| EP | 0 413 625 A | 2/1991 |

OTHER PUBLICATIONS

International Search Report dated Nov. 10, 2009.
Bertuccio et al., "A Spice Model for the Gate Current of HEMT'S", GAAS 97 5th European Gallium Arsenide and Related III-V Compounds Applications Symposium, Bologna, Italy—Sep. 3-5, (Mar. 19, 1997) XP007910455.
Reuschle R et al: "Applikationen Fur Satelliten-Receiver" Funkschau, Weka Fachzeitschriften Verlag, Poing, DE, No. 21, Oct. 6, 1989, pp. 61-65, XP000067559 ISSN: 0016-2841.
Shouxuan Xie et al: "High linearity GaN HEMT power amplifier with pre-linearization gate diode" International Journal of High Speed Electronics and Systems, London, GB, Aug. 4, 2004, pp. 223-228, XP010857782.
Soldner et al: "RF ESD protection strategies: Codesign vs. low-C protection" Microelectronics and Reliability, Elsevier Science Ltd, GB, vol. 47, No. 7, May 31, 2007, pp. 1008-1015, XP022100543 ISSN: 0026-2714.

* cited by examiner (a)

(b)

SELF-ADJUSTING GATE BIAS NETWORK FOR FIELD EFFECT TRANSISTORS

This application is a 371 application of PCT/EP2009/0619752 filed Sep. 15, 2009, which claims foreign priority benefit under 35 U.S.C. §119 of European Application No. 08164363.7 filed Sep. 15, 2008.

The present invention is directed to a self-adjusting gate bias network for field effect transistors, specifically a self-adjusting gate bias network for field effect transistors in radio frequency applications.

BACKGROUND OF THE INVENTION

In radio frequency (RF) applications of field effect transistors, in addition to a radio frequency signal, a DC network is connected to the gate and the drain electrode of a transistor providing a gate and a drain bias to set the operating point of the transistor.

A typical example of a field effect transistor with a gate bias network is shown in FIG. 1a and FIG. 2a. A gate electrode of a field effect transistor 1 is connected to a radio frequency source 3 and a DC or low frequency network 4. The DC network 4, here consisting of a DC source, sets the operating point of the transistor. As shown in FIG. 1, the radio frequency network 3 and the DC network 4 are usually coupled to the gate electrode of the field effect transistor via a bias-T device 6. The bias-T 6 feeds the DC to the transistor 1 and also decouples the RF input and output path. The bias-T usually consists of an RF choke (inductor) or RF block 13 in series at the DC path which acts as a through for DC, and a capacitor or DC block 14 in series at the RF path which blocks DC current to flow towards the RF source 3 but at the same time lets the RF pass through to the gate electrode of the transistor 1. The source of the transistor 1 is connected to ground. The transistor drain is also coupled via a drain bias-T 7 to a drain DC network 8, here just a DC source, and a load 2.

Under normal operating conditions, the transistor 1 the DC voltage at the gate is kept negative, for a High Electron Mobility Transistor (HEMT) usually between −5 to 0 V. A HEMT is a field effect transistor incorporating a junction between two materials with different band gaps, i.e. a heterojunction, as the channel. The amount of negative voltage of the gate bias network 4 controls the current flow in the channel to the drain. The negative voltage varies for different FET according to design and physical properties. Due to the negative voltage, a very small negative current flows from the DC network 4 to the gate electrode of transistor 1, indicated by the full black arrow in FIG. 2a. FIG. 2a is a schematic diagram of the same network as in FIG. 1 without the details of the bias-T's 6 and 7. A so called pinch-off condition of the DC network 4 is defined by the negative voltage when the channel is totally off, i.e. no DC current flows into the channel or to the load connected to the drain. An example of a radio frequency network 3 in FIG. 1 may be a power amplifier or an oscillator feedback circuit for establishing oscillations.

In power amplifier applications, the linearity specification is very important to prevent neighbouring channel interference. Linearity is, e.g., a crucial issue in modern wireless communication. Under normal driving conditions of the FET 1 in FIG. 1 and FIG. 2a, the RF signal 3 at the input is very small and the device 1 operates in its linear region, thus signal distortion is very small. In such a case, a very small negative current flow towards the gate of the device 1 and a high positive drain current flow towards the drain, see FIG. 2a.

However, in communication front ends under overdrive conditions, the distortion components may disturb the wireless communication in a number of different ways. The amplifier may be overdriven by a very large input signal. As a consequence, the amplifier may produce distortion components, which interfere its neighbouring channel. The overdriving input signal may also result from an undesired origin. Possible undesired signals could be a large jamming signal from radar or any other transmitter. The large input signal may also come from the transmitter amplifier in a transceiver system. In FIG. 2b an overdrive condition of the device of FIG. 2a is shown, where the gate current of the FET 1 increases and becomes eventually positive as indicated by the arrow in the gate DC path. In this condition, the device 1 produces very high distortion products, which may damage the device.

In such overdrive applications, it would be desirable to adjust the operating point of the transistor or the DC source voltage to suppress distortion components.

Another very important application of field effect transistors in RF-engineering are oscillators. Here, not a signal from a power amplifier, but a signal from a feedback circuit may be connected to the gate electrode of a field effect transistor to generate periodical signals, the main task of an oscillator circuit. In most cases a sine in time domain is provided at the oscillators output. Square or triangle are also familiar wave shapes. Oscillators are available for a number of very different applications having very different properties. In communication applications, an oscillator with a very low phase noise is important. In case of large power generation, the noise in phase is less important.

In order to start and/or maintain the oscillation, a certain amplification of the signal is required. Therefore, the transistors bias point often destines the class of operation. Basically, a transistor may be operated in different classes. Several classes are known: A, AB, B, C, D, E, F. In class A, the linearity is very good, however the efficiency is very bad. It may theoretically up to 50%, but in most applications the class A efficiency is less than the ideal value of 50%. With classes AB, B, C, E, F the efficiency increases but the linearity decreases. Different classes of operation have different properties. For oscillator design, class A is very nice and easy to realize. In class C, the design becomes more difficult, because the start up condition is not fulfilled.

Therefore, also in oscillator applications of a field effect transistors, the setting of the bias point is important and adjustment in order to establish and maintain oscillations desirable.

SUMMARY OF THE INVENTION

It is an object of the present invention to provide a self-bias network for field effect transistors. It is a further object of the invention to increase the robustness of a field effect transistor in relation to overdrive situations of an amplifier or an oscillator. A further object of the invention is to provide a bias network for field effect transistors, which changes the class of an oscillator during start-up of the oscillation by itself.

Accordingly, a bias network for field effect transistors is provided, comprising a field effect transistor, the field effect transistor having an internal gate diode, a source electrode connected to ground and a drain electrode connected to a load; a radio frequency network connected to the gate electrode of the field effect transistor; a gate bias network connected to the gate electrode of the field effect transistor; and a device having a non-linear characteristic is provided in series between the gate electrode of the field effect transistor and the gate bias network. The radio frequency network and the gate bias network are connected to the gate electrode of the field effect transistor via a gate bias-T device and wherein the device having non-linear characteristic is provided between the gate bias-T device and the gate bias network.

Advantageously, such use of a device having non-linear characteristics leads to a self-adjustment of the bias point of the field effect transistor. In the case that the RF network is an amplifier, this leads an improved linearity of the field effect transistor in overdrive situations. Using the proposed bias, the power amplifier may be restricted from being over distorted.

The device having a non-linear characteristic may be provided such that a forward bias current at the gate electrode of the field effect transistor is inhibited or reduced.

In case the RF network is an oscillator feedback circuit, after switch-on of the oscillator the self-adjustment of the bias point leads to a change of the oscillator class.

Preferably, the gate bias network provides a negative DC voltage to the gate electrode of the field effect transistor and the device having a non-linear characteristic is arranged such that a negative current passes through the device but a positive current is blocked.

The device having a non-linear characteristic may further comprises a diode or a transistor or a network having the characteristic of a diode. The field effect transistor may be a HEMT transistor.

A second bias-T device may be provided between the drain electrode and the load as well as between the drain electrode and a drain bias network.

The radio frequency network may input the output signal of a power amplifier to the field effect transistor. The radio frequency network may instead input the output signal of a feedback network such that an oscillator network is established, wherein the self-adjustment of the bias network leads to a change of class of the oscillator after start-on.

The device having non-linear characteristics may be realized as a diode, wherein a zener diode may be connected to a point between the diode and the bias-T such that the DC voltage is limited in the negative direction.

Accordingly, a method for self-adjustment of a bias point of a field effect transistor in RF applications, comprising the steps of: providing a negative DC voltage by a gate bias network to a gate electrode of a field effect transistor and providing an additional RF signal by a RF network to the gate electrode such that a negative current flows towards the gate of the field effect transistor; Increasing the RF signal of the RF network, whereupon the gate current increases to become positive; Self-adjusting the bias point of the field-effect transistor by blocking the gate current by the device having non-linear characteristics from reaching the gate electrode, whereupon the DC voltage at the gate electrode of the field effect transistor becomes more negative.

An oscillator feedback-circuit may be connected to the gate electrode of the transistor and the self-adjustment of the bias point may lead to a change of the oscillators class.

The method may further comprise the step of limiting the maximum negative value of the self-adjustment of the bias point by providing a zener diode between the device with non-linear characteristics and the gate electrode.

In addition, the use of a device having non-linear characteristics in a bias network of a field effect transistor is claimed for the self-adjustment of the bias point of the field effect transistor, wherein the device is provided in series between a gate electrode of the field effect transistor and a gate bias network such that a forward bias current at the gate electrode of the field effect transistor is inhibited.

BRIEF DESCRIPTION OF THE DRAWINGS

For a better understanding of these and other objects of the present invention, reference is made to the detailed description of the invention, by way of example, which is to be read in conjunction with the following drawings, wherein like elements are given like reference numbers, and wherein.

DETAILED DESCRIPTION OF THE DRAWINGS

In the following, reference is made to a HEMT transistor as a field effect transistor. However, it is pointed out that such reference is only made by way of example and any field effect transistor may be employed throughout the different embodiments of the present invention.

Figure 3:
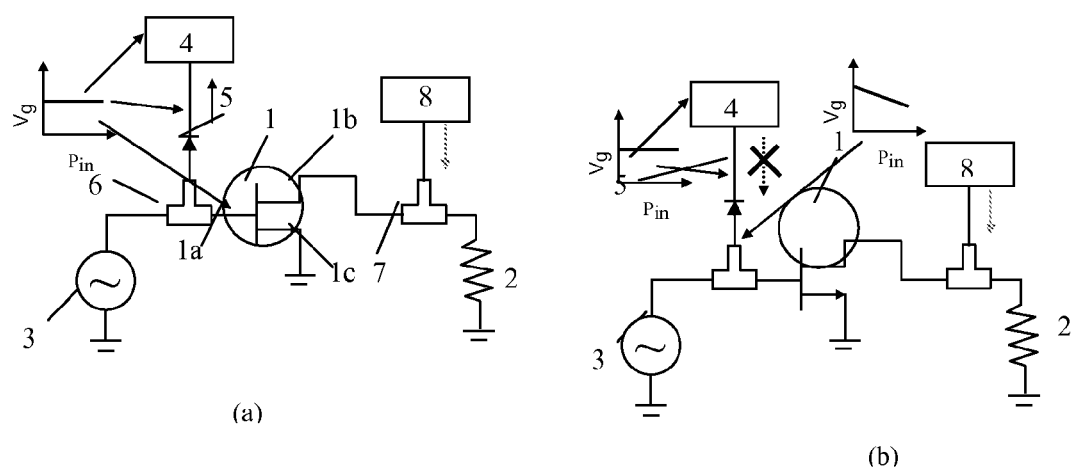
FIG. 3: shows a first embodiment of the present invention under (a) normal operating conditions and (b) overdrive conditions.

FIG. 3 shows a first embodiment of the present invention under (a) normal operating conditions and (b) overdrive conditions.

The gate electrode 1a of a field effect transistor 1 is connected to a gate DC bias network 4 and a radio frequency network 3, wherein the source electrode 1c is connected to ground and the drain electrode 1b is connected to a drain DC bias network 8 and a load 2.

The gate and drain paths usually comprise a gate bias-T 6 and a drain bias-T 7 for coupling the RF signal 3 and the DC signal 4, but this invention is not restricted to the use of bias-Ts. Instead, any other component, which allows the coupling of RF and DC signals while letting through the DC signal and the RF signal to the gate electrode 1a but preventing the DC component to reach the radio frequency network 3 may be used.

Figure 1:
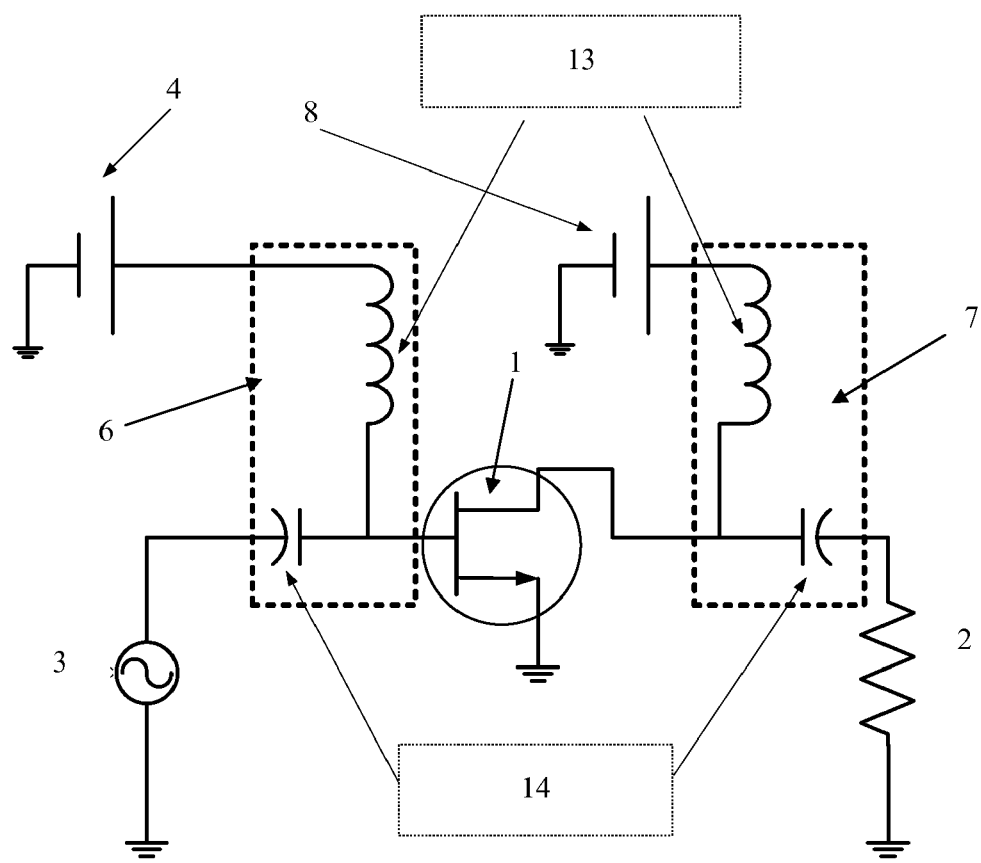
FIG. 1: shows an example of a typical bias network for a field effect transistor with details of drain and gate bias-T devices in the gate and drain path of the field effect transistor, respectively.

The inventive DC bias circuit is similar to a commercial bias network of FIG. 1, but between the gate bias network 4 and the gate electrode 1a, a device 5 having non-linear characteristics is provided such that a forward bias current at the gate electrode 1a of the field effect transistor 1 is inhibited. The field effect transistor 1 is preferably an AlGaN/GaN HEMT. At normal operating conditions, the gate 1a of FET 1 is kept at a negative voltage at a desired bias condition. At this condition, a very small negative current flows towards the gate 1a, i.e. means the internal gate-diode of the FET 1 is in reverse bias. The negative voltage of the DC network 4 at gate electrode 1a delivers a negative current to the gate electrode 1a. It should be noted that the inset graph of the gate voltage Vg in FIG. 3 is only schematically and does not show any sign of the voltage, which is usually negative.

It was surprisingly found that with increasing RF drive signal from the RF network 3 at the gate electrode 1a, the FET 1 enters to a so-called self-bias condition and the previously negative current starts increasing towards zero. When RF drive 3 at the gate 1a becomes very high, the gate current even tries to shift towards positive values. In this operating condition, the internal gate-diode of the FET 1 operates in forward bias. The FET 1 cannot stand this condition and is easily damaged.

The invention restricts this current by using a diode 5. As a consequence, in order to fulfil the diodes 5 zero current condition, the FET 1 is automatically pinched off. As a surprising result, this means that the DC voltage at the gate 1a of the device becomes even more negative, leading to a self-adjustment of the gate bias point of the FET 1.

It is important to notice that the "gate-diode" mentioned above refers to the Schottky diode at the gate 1a of the FET 1, which is an internal diode of the FET 1 and forms a part of the device 1 itself. The device 5 or DC path diode refers to an external p-n diode that is introduced into the DC path 4 as a part of the bias circuitry.

Figure 5:
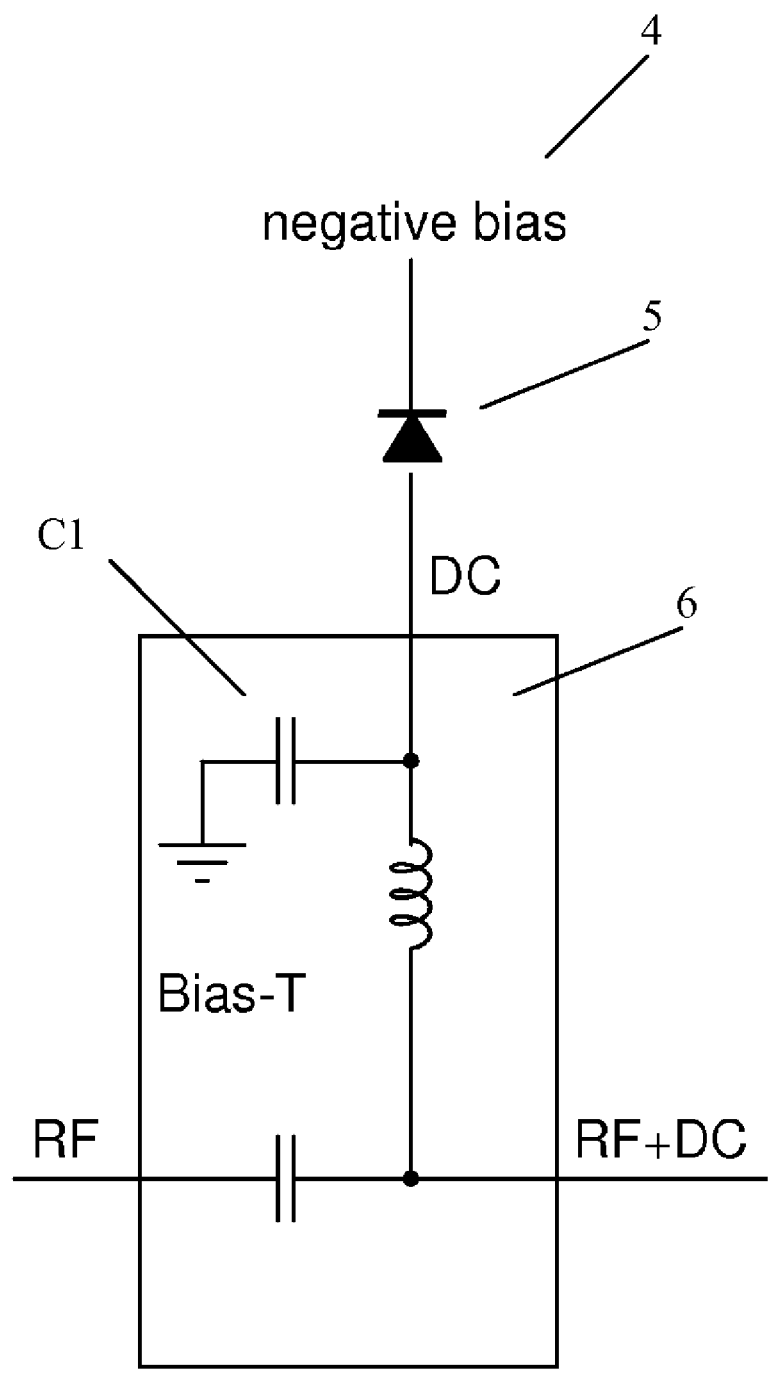
FIG. 5: shows details of a preferred embodiment of the inventive gate bias network inhibiting a forward bias current at the gate electrode of the field effect transistor.
Figure 6:
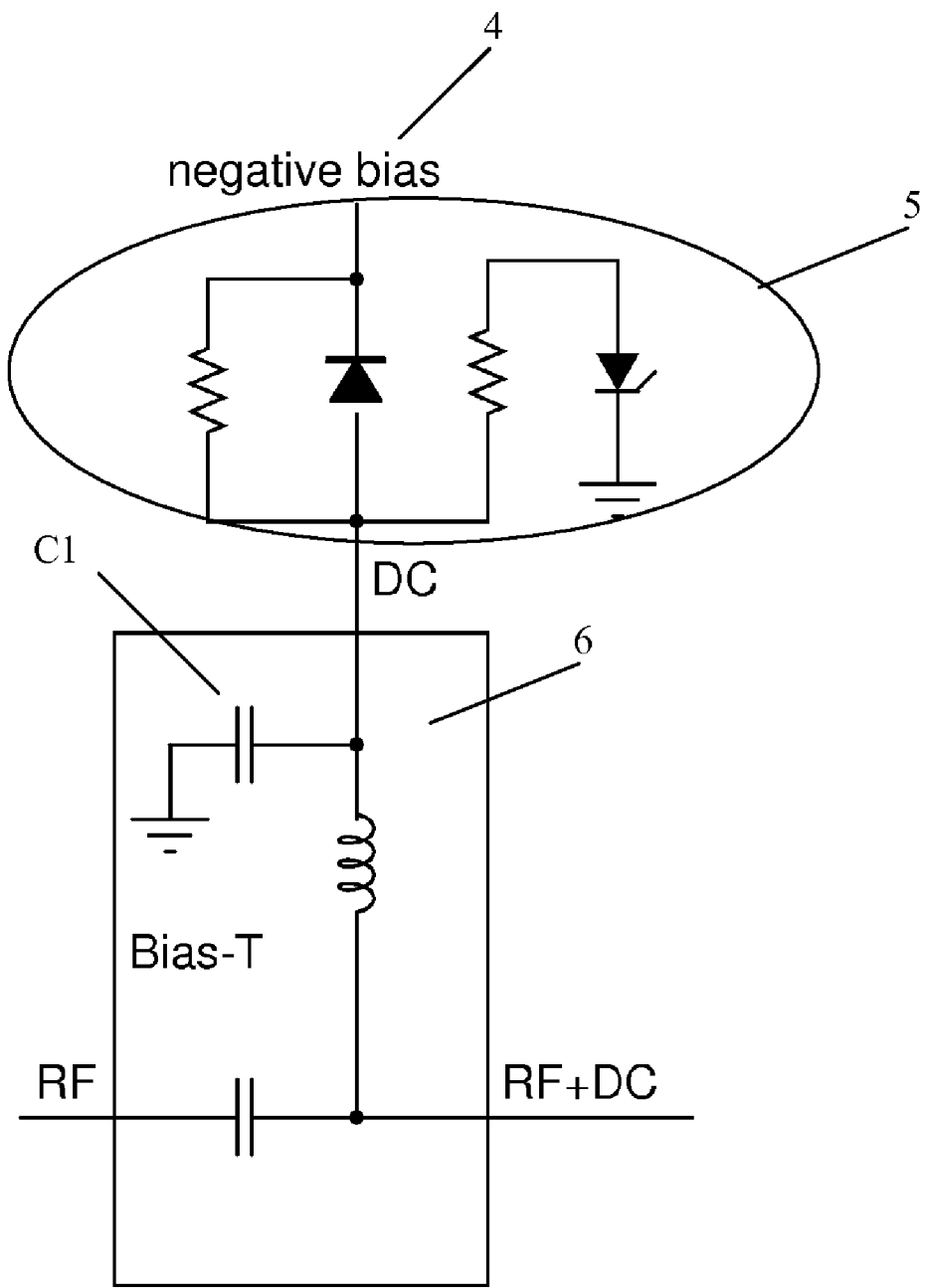
FIG. 6: shows details of an alternative embodiment of the inventive gate bias network of the present invention.

Preferably, the forward bias inhibiting device 5 is realized by a diode arranged such that it lets a negative current pass through to the gate electrode 1a of the field effect transistor 1 but blocks a positive current from reaching the gate electrode 1a. However, the preferred reference to a diode is of no restriction to the present invention. In general, any two- or three-terminal device allowing the prevention of a positive current to reach the gate 1a of the FET 1 may be employed. The device 5 could be a diode as a two-terminal device as displayed in FIG. 5 for the preferred first embodiment. It could also be realized by a transistor as a three terminal device. Also, a sensor, which senses a positive current and digitally regulates the bias voltage may be used. The diode is the simplest device allowing the blocking of a positive gate current, which leads to a self-adjustment of the bias point of the FET 1. Furthermore, additional resistors in series and parallel to the device 5 may be used to realize a source impedance characteristic between pure voltage control and an ideal diode. FIG. 6 shows an alternative embodiment of the device 5. Parallel to the series connected diode between the negative gate bias network 4 and the bias-T 6 is arranged a resistor and a zener diode with a resistor in series is connected to a point between the device 5 and the bias-T 6. The zener diode limits the negative voltage in amplitude and controls the bias point. In case of very high overdrive signals, the negative voltage at the gate of the device can become extremely high. Using the Zener diode and the resistance between gate and ground, this negative voltage can be set to a certain limit according to the breakdown voltage of the zener diode and the resistance. The resistance between the gate and ground dissipates the current from gate and prevents a further negative charging of the gate. The resistors provide, in cooperation with the capacitor of the gate bias-T 6, a bandwidth to define the speed of the reaction. The bias T is primarily a low pass filter. The resistance and the capacitance value define the RC time constant and thus the reaction time for the pinch off. For instance, if the initial bias is −2V and changes to −6V at overdrive conditions, the time for the voltage to go from −2V to −6V depends on the RC time constant and may take a few hundred nanoseconds This may be important for amplifiers in AM operation mode or other fast variations in the level of drive. Also, RLC networks realizing the desired transient behaviour may be used. Thus, throughout the following, any reference made to a diode may be replaced by the above-mentioned devices and networks.

The self-adjustment of the gate bias is described in the following by reference to FIGS. 12-15. The self-adjustment employs the non-linearity of the internal gate-source Schottky diode of the junction field effect transistor 1 having non-linear input characteristics. A junction-FET 1 is a voltage driven component.

Figure 11:
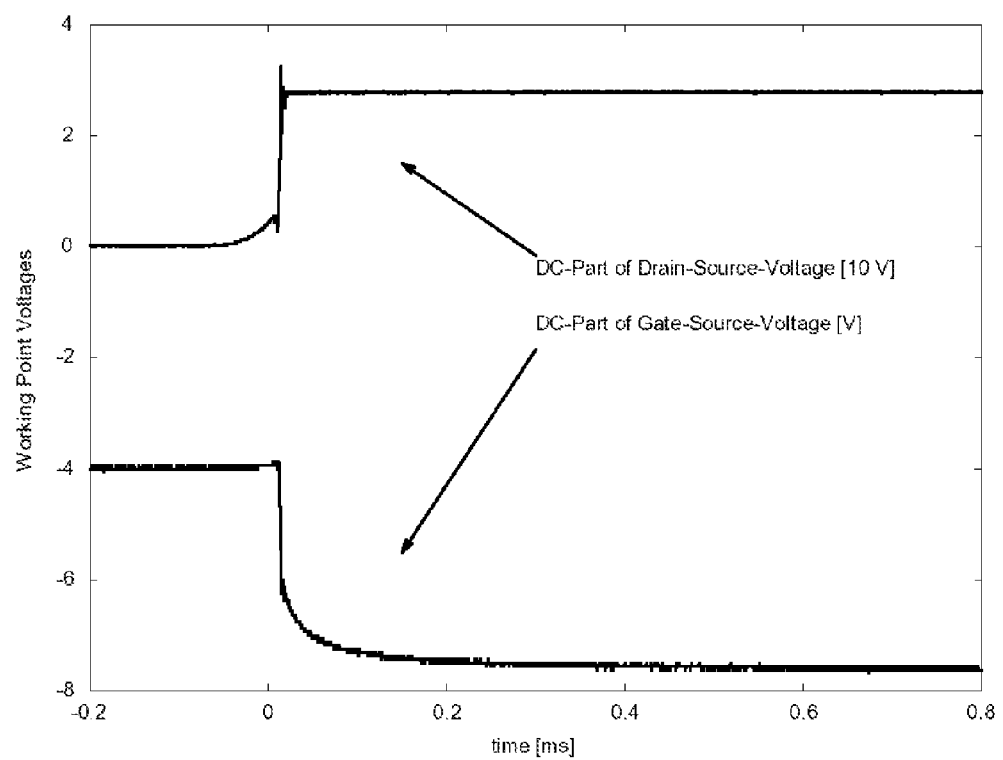
FIG. 11: shows a changing of the bias point during oscillation switch on for the second embodiment of the invention of FIG. 10.
Figure 12:
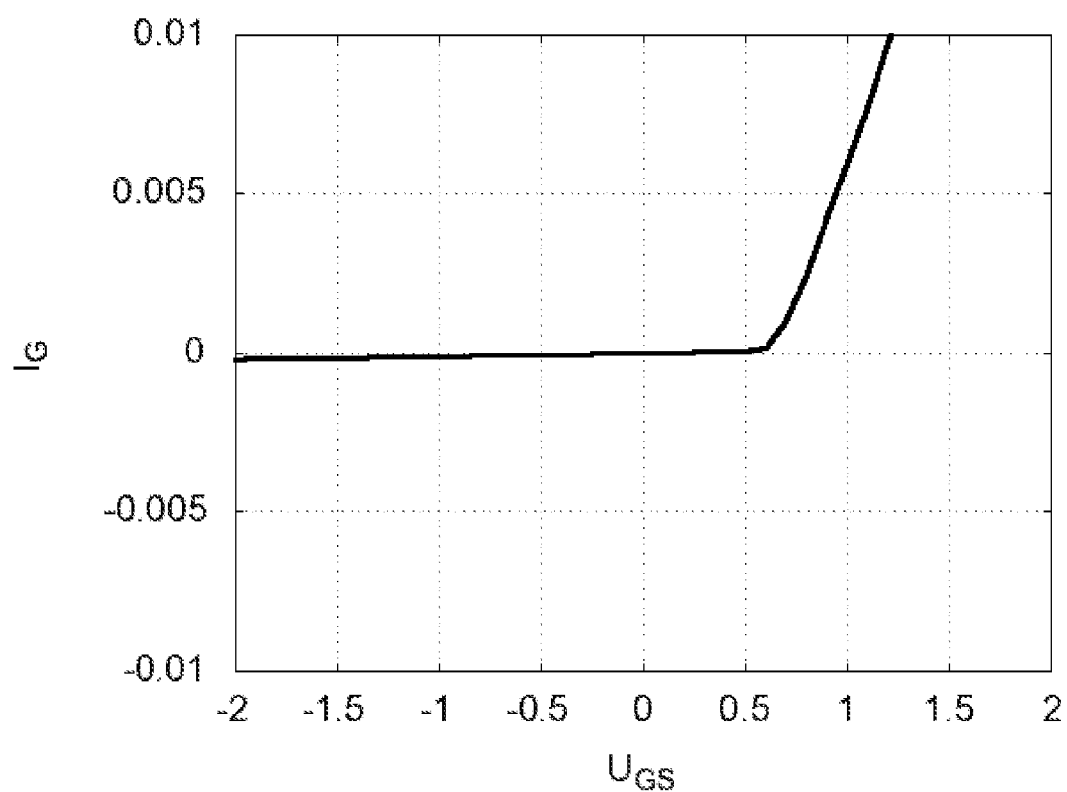
FIG. 12: shows the gate current vs. gate-source voltage of transistor 1 in FIGS. 3 and 10.
Figure 13:
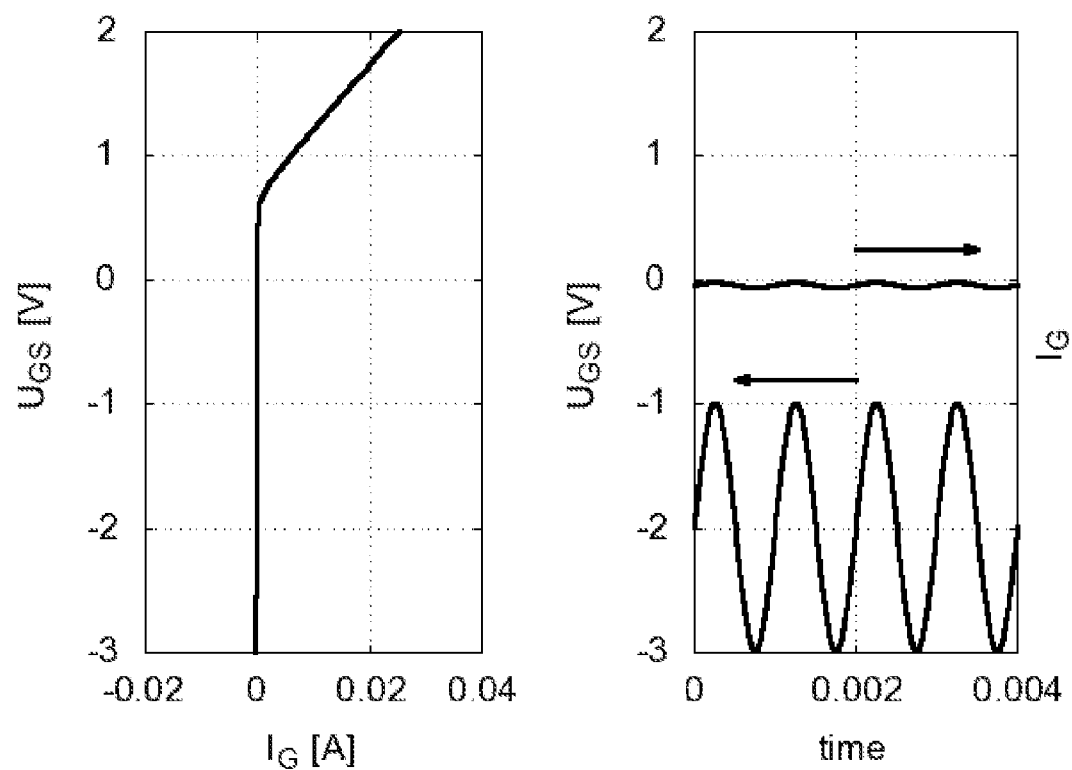
FIG. 13 shows in the left part FIG. 12 rotated by 90°, and in the right part the gate-source voltage versus time (lower right part) as well as the gate current vs. time (upper right part) of transistor 1.

The direct current gate-source characteristic line of the FET 1 of FIG. 11 is similar to that of a diode, resulting from the general design of a field effect transistor. For junction-FETs, the gate of the transistor is realized as a PN-contact or a metal-semiconductor contact. Both implementations of the gate result in the formation of an internal diode, a PN-diode or Schottky diode.

Now, transistor 1 is usually driven at operating points at which the gate current is negligible small and negative. The gate current Ig is the result of the transfer function of the internal diode characteristic line. The gate current Ig is composed of a negative direct current part and an alternating current part, the latter shown in the lower right part of FIG. 13. For instance, the direct current operating point voltage may be −2V, a voltage at which the direct current would be negative, see FIG. 12 or left part of FIG. 13, and the alternating current part may be $1V*\sin(\omega t)$. The resulting current would consequently follow the equation $Ugs=-2V+1V*\sin(\omega t)$. As can be seen in the upper right part of FIG. 13, the gate current Ig is small and negative.

Figure 14:
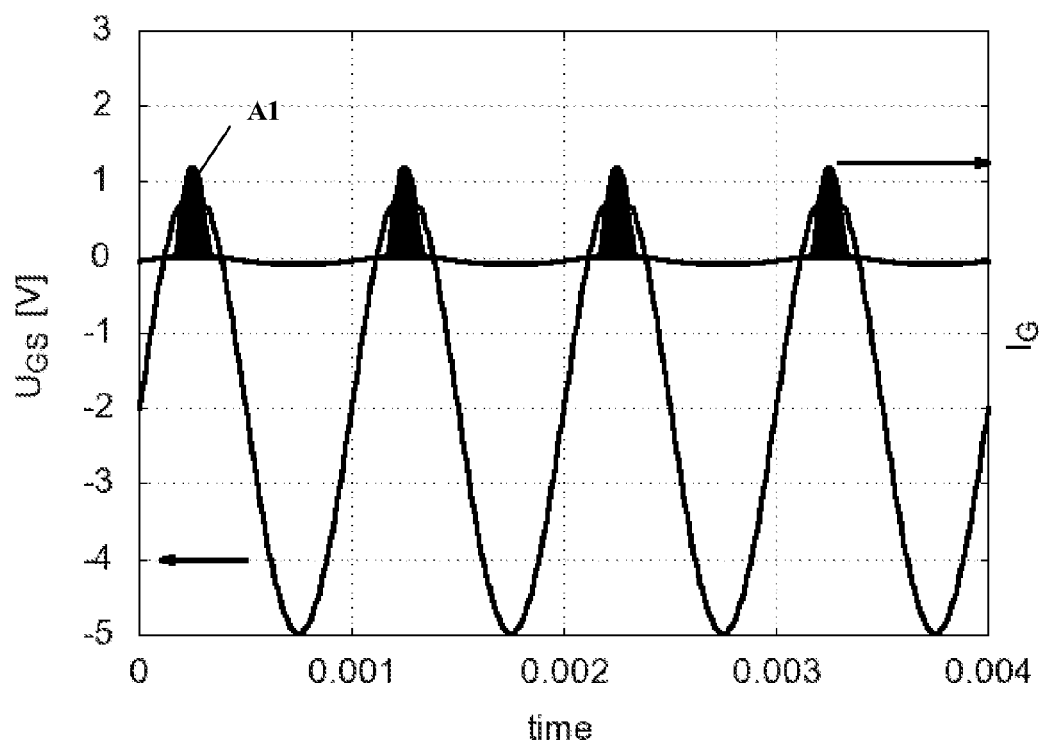
FIG. 14: shows the gate-source voltage vs. time of transistor 1.

The function employed in the present application is based on the requirement of an internal, non-linear diode characteristic line of transistor 1, the characteristic line preferably following an exponential function. If now the alternating current, e.g. a sinusoidal alternating current, at the gate strongly increases, the sum of the direct current and the alternating current may become positive in certain parts, e.g. the maxima of the alternating current. Consequently, due to the non-linear characteristic of the internal gate-diode of transistor 1, the shape of the gate current becomes non-sinusoidal having larger positive areas A1 than negative areas, as shown in FIG. 14. FIG. 14 shows the gate current in the upper part and the sinusoidal gate-source voltage in the lower part. The positive region A1 under the gate current line thus becomes larger than the negative region. Thus, the gate current now changes sign from negative to positive currents. This sign change is employed in the present invention by placing a diode 5 between the DC part of the gate bias network 4 and the field effect transistor 1, which limits the gate current to the negative region. This prevention of a positive gate current results in a DC self-adjustment of the operating point of transistor 1. Since the positive current is not allowed to pass diode 5, it charges capacitor C1 to more negative values, which is equivalent to a change of the gate-source voltage Ugs. This can be seen in FIG. 15 by the thick black line in the lower part, which shows the DC part of the gate-source voltage, i.e. the operating point. The direct current part Ugs changes slowly with respect to the period length of the alternating current signal shown. The direct current charges capacitor C1 of the bias network with a different and lower voltage until the positive part of the gate current is equal to the negative part of the gate current, i.e. until no DC part exists. This re-charging of capacitor C1 leads to the self-adjustment and depends on the height of the amplitude of the input signal. If the DC-part of current Ig is negative, the current is able to flow between the source of the DC-part 4 and transistor 1. If the current is positive, the DC-part 4 is not able to steadily flow into transistor 1 since the current is blocked by the inventive diode 5. The positive DC current of Ig thus comes from capacitor C1. The capacitor is consequently re-loaded and changes its voltage value, which is identical with the operation point of transistor 1.

Figure 15:
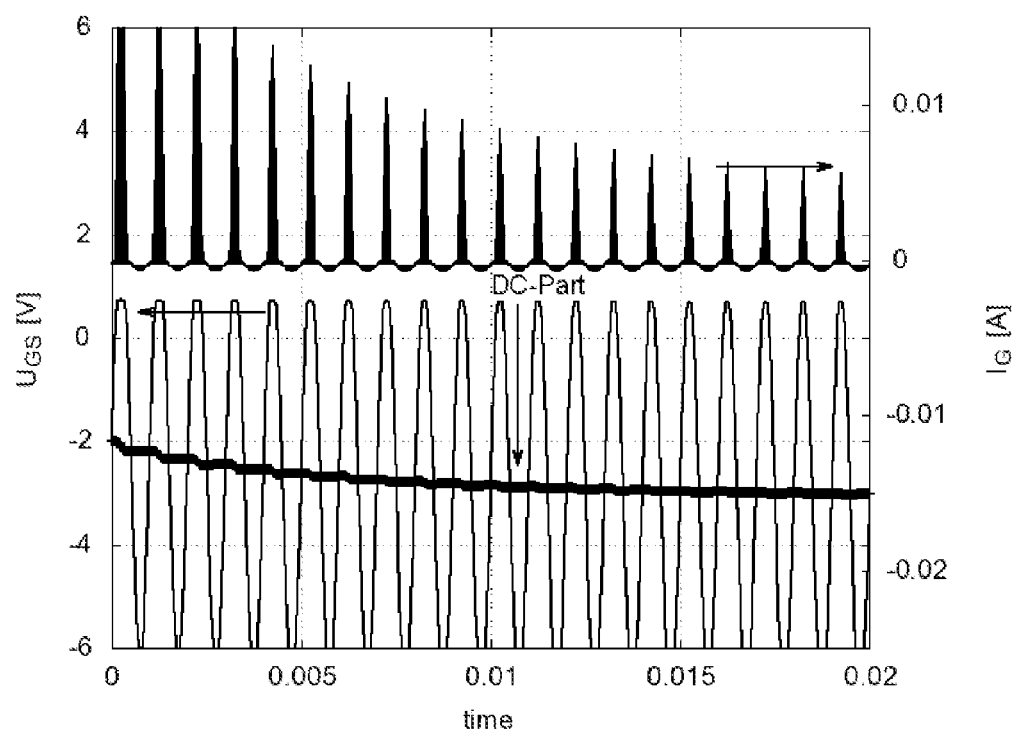
FIG. 15: shows the gate-source voltage vs. time (lower part) and the gate voltage vs. time (upper part).

In the example, the capacitor C1 is charged from −2V to −3V over time resulting in a shift of the operating point of transistor 1 from −2V to −3V and smaller amplification of the positive part of the gate current Ig as can be seen from the upper part of FIG. 15. Please note that the size of the positive areas A1 of the gate current Ig decreases over time.

To conclude, upon a significant increase of the alternating current part at transistor 1 which usually would result in distortions, the employment of a diode 5 between the gate of transistor 1 and the DC bias network 4 results in a self-adjustment of the operating point of transistor 1 and thus a prevention of distortions.

A possible application of the RF source network 3 may be an amplifier. As initially stated, linearity is a crucial issue in modern wireless communication. Power amplifier linearity specification is very important to assure neighboring channel interference. If the amplifier is overdriven, it generates very high distortion components, which may completely block the neighboring channel or desensitize the front end LNA. Using the proposed bias network including the series connected device 5, the power amplifier can be restricted from being over distorted.

Figure 4:
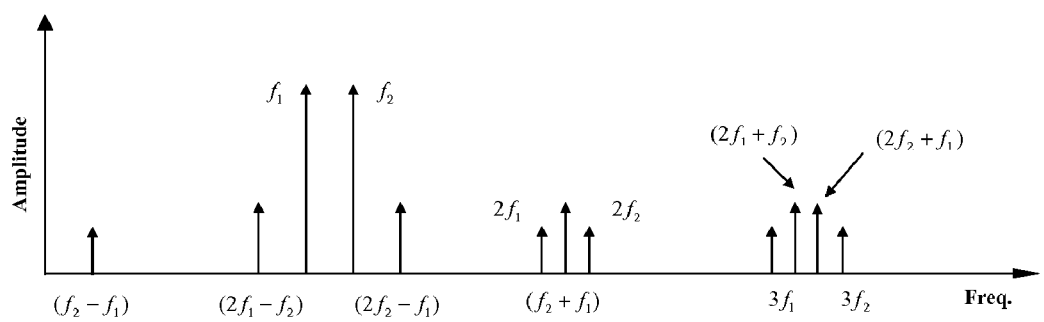
FIG. 4: shows the output spectrum of a device excited with a two-tone signal.

If an RF amplifier is used to amplify a pure sine wave then the output signal consists of the amplified signal and higher harmonics. The nearest harmonic product occurs at the double of the signal frequency and thus can be filtered out easily. For a modulated signal, however, this does not work anymore because mixing products are generated which fall in the signal band and it is impossible to filter them out. These mixing products are called intermodulation distortion products. The simplest signal having such characteristics is a two-tone signal, which is similar to an amplitude-modulated signal. A two-tone signal consists of two closely spaced sine waves. The following equations and FIG. 4 illustrate the intermodulation distortion mechanism.

If we consider an amplifier or any device that has a non-linear transfer characteristic, then the output of the device can be written as the function of input as a power series:

$$V_{out} = a_0 + a_1 \cdot V_{in} + a_2 \cdot V_{in}^2 + a_3 \cdot V_{in}^3 + \ldots a_n \cdot V_{in}^n + \quad (1)$$

A simple two-tone signal having the same amplitude A can be written as:

$$f_1 + f_2 = A(\sin \omega_1 t + \sin \omega_2 t) \quad (2)$$

The next step is to replace Vin in equation (1) by the two-tone signal as shown in equation 2 and to do some mathematical manipulations to have a spectral representation. FIG. 4 shows the resulting frequency components considering the terms up to third order in equation 1, Table-1 adds details on the respective spectral lines.

TABLE 1

List of output frequency components of a nonlinear system excited by a two-tone signal. The phase of a term is defined by its behavior at t = 0.

| Frequency components | Magnitude | Phase |
|---|---|---|
| dc | $a_0 + a_1 \cdot A^2$ | ... |
| $f_1, f_2$ | $a_1 A + \frac{9}{4} a_3 \cdot A^2$ | Sin |
| $2f_1, 2f_2$ | $\frac{1}{2} a_2 \cdot A^2$ | -Cosine |
| $3f_1, 3f_2$ | $\frac{1}{4} a_3 \cdot A^3$ | -Sin |
| $(f_1 + f_2), (f_2 - f_1)$ | $a_2 \cdot A^2$ | -Cosine, Cosine |
| $(2f_1 + f_2), (2f_2 + f_1)$ | $\frac{3}{4} a_3 \cdot A^3$ | -Sin |
| $(2f_1 - f_2)$ | $\frac{3}{4} a_3 \cdot A^3$ | Sin for $2f_1 \rangle f_2$ Otherwise −sin |
| $(f_1 + 2f_2), (f_1 - 2f_2)$ | $\frac{3}{4} a_3 \cdot A^3$ | Sin for $2f_2 \rangle f_1$ Otherwise −sin |

The components at $(2f_1-f_2)$, $(2f_2-f_1)$ are of special interest because they fall inside the signal band. They are commonly referred to as third-order intermodulation products (IM3). $(2f_1-f_2)$ is called "IM3L" and $(2f_2-f_1)$ is called "IM3R" where "L" and "R" stand for Left and Right sideband. If the input signal is increased by a factor x then IM3 products will increase by $x^3$. That means in a flat gain operation, if the input and output fundamental signal amplitude is increased by 1 dB, the third-order components grow by 3 dB. If we imagine that we could increase the input signal amplitude further and further while maintaining this slope, at some point the IM3 will meet the Pout curve. This point is defined as third-order intercept point, often abbreviated as IP3 or TOI. This point is normally a point derived by extrapolation. A real amplifier will reach saturation far below this power level. The IP3 has been the most widely used measure for defining device linearity. Intercept points of any order can be calculated by a single RF measurement when applying the following formulas, $$IP_n = Pout_{(fundamental)} + \frac{(Suppression)_n}{(n-1)} \quad (2)$$

where, $$(Suppression)_n = Pout_{(fundamental)} - Pout_{(IMn)}$$

For IP3, one obtains the specific result $$IP_3 = Pout_{(fundamental)} + \frac{Pout_{(fundamental)} - Pout_{(IM3)}}{2} \quad (3)$$

This calculation is valid only if the measurement is performed carefully within the linear operation regime ensuring that the distortion products are well above the noise level.

C/I ratio is carrier to intermodulation ratio which is the difference between the power of carrier signal and the distortion signal.

$$C/I\_L = P\text{out}_{(Fund\_L)} - P\text{out}_{(IM3\_L)} \text{ and}$$

$$C/I\_R = P\text{out}_{(Fund\_R)} - P\text{out}_{(IM3\_R)}$$

That means, the larger the value of C/I, the better the linearity, or the distortion compared to the signal strength is low. This measure is more realistic than IP3 as it deals with a complete power sweep. This is not an imaginary extrapolated number. Therefore, it is of special interest to see the distortion at overdrive condition in the present invention.

By using the proposed bias network, the distortion products are suppressed by a significant amount while this condition does not hamper normal operation, i.e. when the device operates in the linear region.

Figure 7:
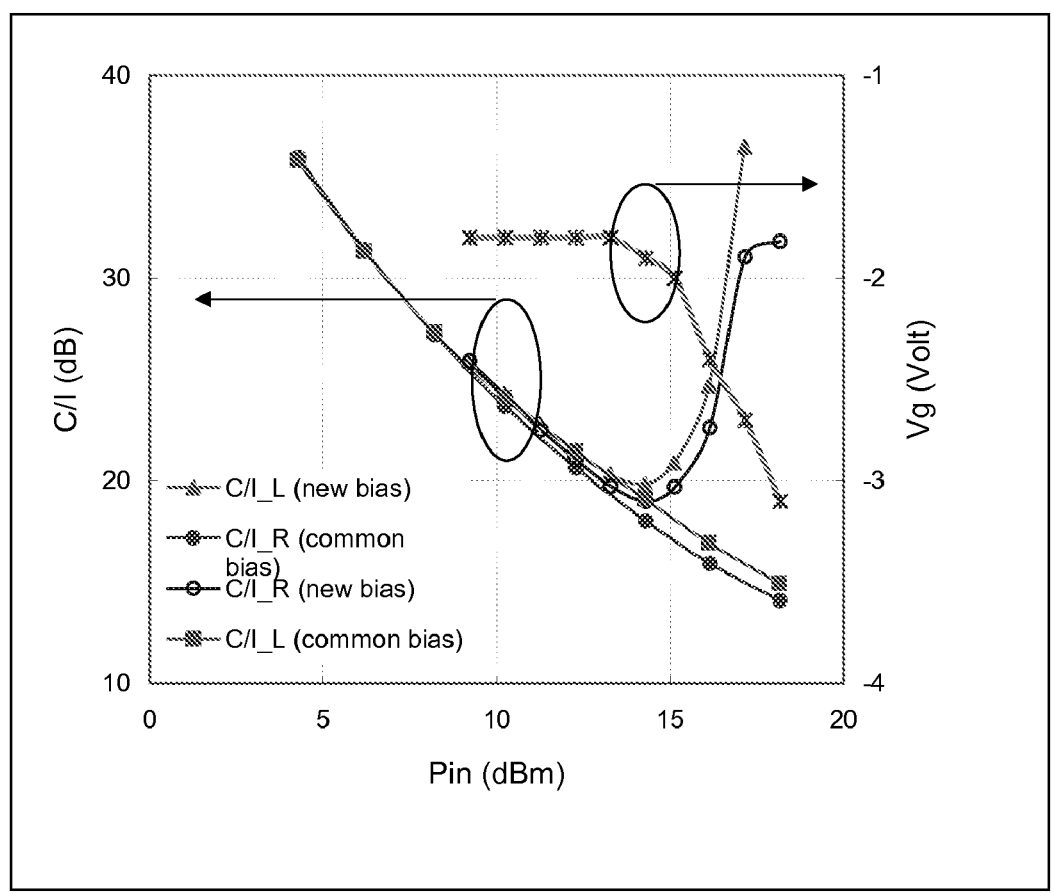
FIG. 7: shows the C/I ratio over input driving power of the first embodiment of the present invention.
Figure 8:
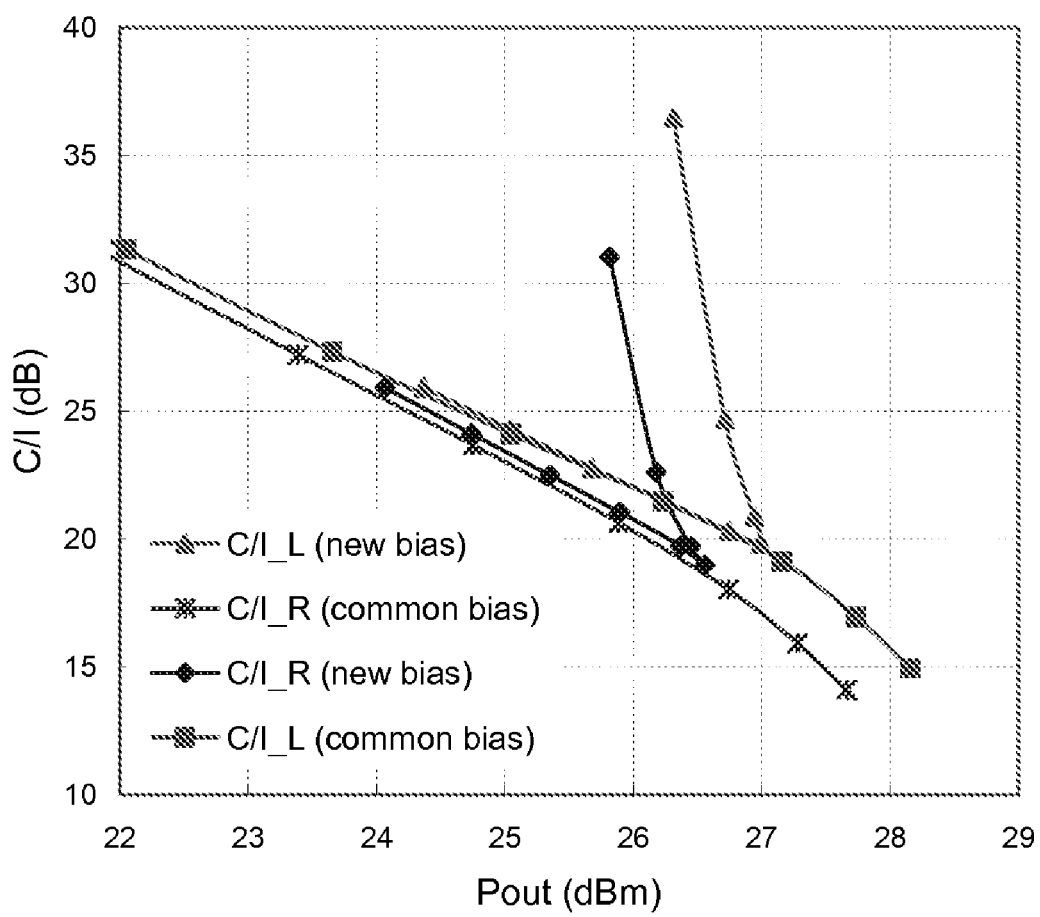
FIG. 8: shows the C/I ratio over output power of the first embodiment of the present invention.

In the following figures some measurement examples are provided. In FIG. 7, the input RF power is swept from a very small power to very large overdrive. The C/I ratio over input driving power of FIG. 7 is measured at 2 GHz with a tone spacing of 10 MHz, Vd=28V and Vg=−1.8 V (at DC source). In FIG. 8, the C/I ratio is shown over output power.

Figure 2:
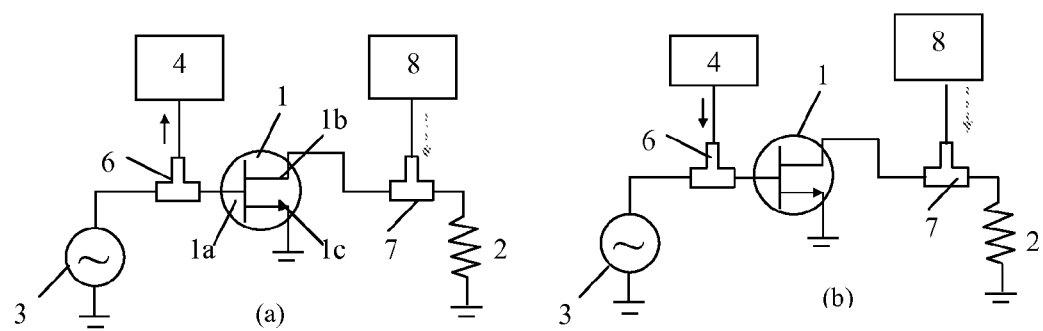
FIG. 2: shows the same example as in FIG. 1 but without the details of bias-T devices in the gate and drain path under (a) normal operating conditions and (b) overdrive conditions.
Figure 9:
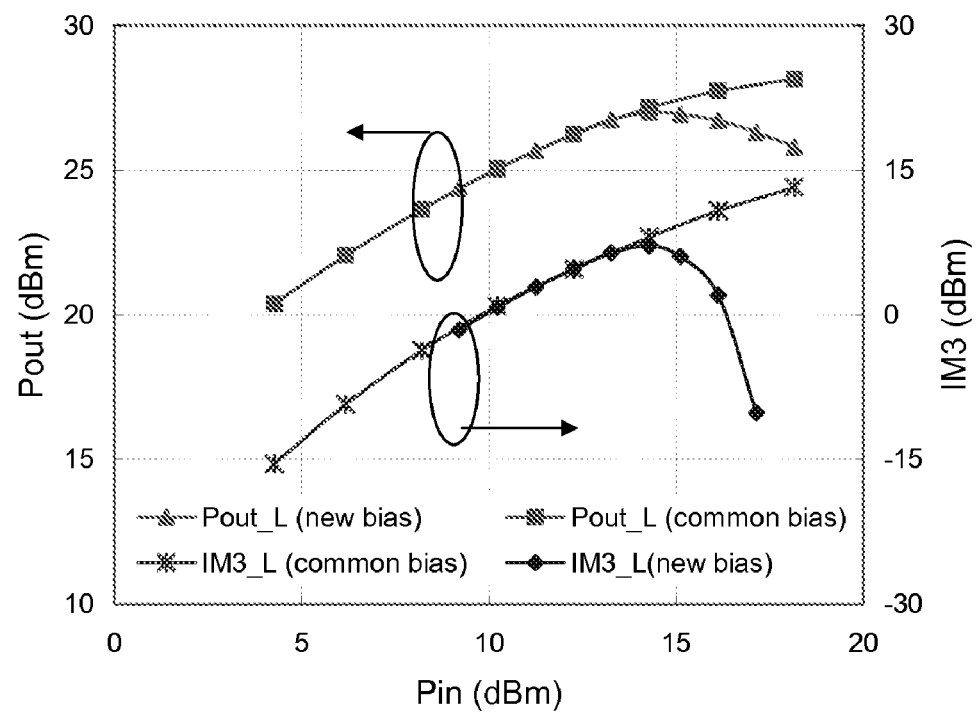
FIG. 9: shows the output power and IM3 power of the first embodiment of the present invention (other data same as in FIG. 8)

As can be seen from FIG. 7, the overdrive region starts at about 12-14 dBm input power. After a certain value of Pin, the C/I drops drastically in case of operation with normal bias network 4 of FIG. 2 resulting in very high distortion. In case of the inventive bias network 4 with device 5, the C/I ratio does not fall anymore at an overdrive condition above 13 dBm. The new bias network automatically pinches off the device and the negative voltage at the gate 1a becomes even more negative. The DC gate voltage of the DC bias network 4 at the device 1 is also plotted in FIG. 7. Under normal conditions, the DC gate voltage is −1.8 V. However, with increasing RF input power from RF network 3, at about 13 dBm the DC gate voltage drops and reaches −3 Volt at about 17 dBm. It can be seen that the C/I curve inverts its direction in case of the inventive self-adjusting bias network with device 5. This is because the output-power slightly drops due to pinching-off. FIG. 9 shows the output power and IM3 power (other data same as in FIG. 8). The right scale (IM3) is weighted three times more than the left (Pout) scale. The circles indicate which scale applies. However, this device 5 should not be understood as a replacement of a linearizer. This work does not deal with usual linearization. In usual linearization applications, special circuitry is used to cancel out or suppress the distortion products keeping the output power high in the region, in which the amplifier usually operates. In our case, the device is a protection and stops the amplifier to be over distortive in overdrive conditions from an unwanted source and thus does not interfere with other channels. In other words, linearizers are circuits which straighten the transistor characteristic. Usually, a pre amplifier is used having an inverse characteristic with respect to the transistor. This is not done here. Instead, the characteristic is cut in the overdrive region such that distortions are prevented. It just protects the amplifier 3 to be over-distortive. The distortion components can be either from its own input signal or can be due to any over distorted neighboring amplifier or any kind of jamming signal.

Figure 10:
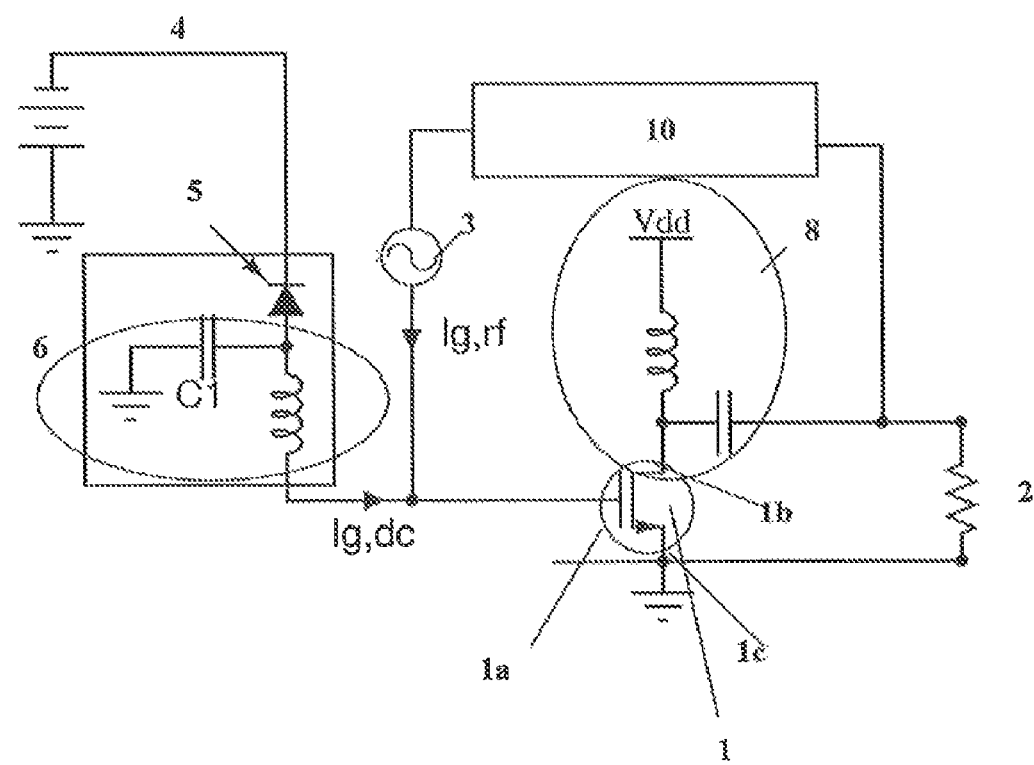
FIG. 10: shows a second embodiment of the present invention, an oscillator circuit using the inventive bias network.

FIG. 10 is directed to a second embodiment of the present invention, an oscillator circuit using the inventive self-adjusting bias network comprising a normal bias network 4 and a device 5 inhibiting a positive DC current to reach the gate electrode 1a. It contains an active element, preferably a pHEMT. The transistors source 1c is connected to ground. The drain 1b is connected to a drain power supply 8 via an inductor that provides only a flow of DC-current as part of a drain bias-T 7. Furthermore the transistors drain 1b is connected to the oscillators load 2, for instance a resistor or output port, via a capacitor as another part of the bias-T 7. The drain electrode 1b is also connected to a feedback network 10 via the same capacitor. The capacitor kills every DC-portion. Only the RF-power from the feedback circuit 10 is able to flow through the capacitor. The feedback's output is connected to the transistors gate electrode 1a. It provides a small part of the oscillators output signal with a phase that is necessary for operation. The phase of the whole loop is 0 or a multiple of 2π.

The novel self-adjusting gate bias network is very important for the benefit of the invention. The transistors gate 1a is also connected to the DC gate voltage supply 4 via an inductor and a diode as a preferred embodiment of device 5 in series. The invented use of the diode is to suppress a current with a wrong direction, here a positive direction. Between these both elements a capacitor C1 is parallel connected to ground.

The gate bias voltage 4 is usually negative. For this reason, the DC-current Ig,DC is also negative and is able to flow through the inductor and through the diode 5. The alignment of the diode is for negative current. With a high RF amplitude of the feedback circuit 10, at the transistors gate 1a the DC-current Ig,DC would like to become positive. The diode 5 as used prohibits a positive current from reaching the gate electrode 1a. However, a small part of a positive current flows, not continuously, but rather only limited in time, into the capacitor C1. The consequence is a variation of the capacitors voltage, which is equal to a variation of the Gate-Source-voltage.

FIG. 11 shows a changing of the field effect transistors bias point during oscillation switch-on for the second embodiment of the invention as shown in FIG. 10. It shows measurement curves of a realized oscillator that is using the present invention. The top curve displays the drain-source-voltage of the transistor 1 that is used in the oscillator circuit of FIG. 10. If the voltage is zero, the oscillator is turned off. If the voltage rises, the oscillator is switched-on. At time zero the Drain-Source-Voltage is turned on from 0V to 2.8V. At this point in time the oscillator starts its operation, i.e. the generation of an oscillation. The lower curve displays the DC-part of the transistors input. This voltage is for gallium nitride HEMTs negative. In our example −4V. The inventive usage of a device inhibiting a positive current to reach the gate electrode 1a, realized preferably by a diode in the transistors input network gives the circuit the possibility to self-adjust its gate-DC-voltage. In FIG. 11, the gate-voltage changes at t=0 from −4 V to −7 V. This variation is not added by the DC power supply 4. This reduction of the voltage level is done by the oscillator circuit itself through self-biasing of the bias point of the field effect transistor 1. The data are observed passively with an oscilloscope. The Gate-Voltage changes to become more negative by the oscillators signal itself. The variation in the gate-source-voltage shifts the bias point from class A to C by passing AB and B. A self-adjusting class of operation is the effect.

During switch-on, the oscillator microwave amplitude rises up at the transistors gate 1a. The large transistor input amplitude is generating a positive DC current due to the effect of non-linear input characteristic. It is an effect of partly rectification. That means the voltage amplitude at the transistors internal gate-source-diode is generating an asymmetric current. Asymmetry matters: the current has a DC-fraction. This DC-current cannot flow continuously since there is no DC-path to anywhere, i.e. not to the feedback circuit and also not to the gate-voltage supply 4 because of the invented usage of a diode 5. The diode 5 of the gate bias network prevents a fixed DC-gate-voltage. The temporary DC-current is recharging the bias-T's 6 filter capacitor until the current is zero. During recharging, the voltage is changed towards negative. The speed of changing the voltage is given by the ratio between the DC-current that is generated by the transistors input characteristic and the value of bias-T's filter capacitor:

$$\frac{dU_{Gate \cdot DC}}{dt} = -\frac{I_{g,DC}}{C_1}$$

The recharging of the capacitor C1 and the following voltage variation has a strong influence on the circuit. At first the bias point changes. For this reason also the efficiency, linearity, DC-supply and microwave output power will change. The class of operation also changes.

In the given second embodiment, the bias point is shifted in a way that changes it class from A to C. A usage of the nice start-up condition of class A and shifting the bias point into class C region for better efficiency. Oscillators in large signal regime is the main focus.

Thus, this invention offers new capabilities in designing oscillators and power amplifiers.

LIST OF REFERENCE SIGNS 1 field effect transistor
   1a gate electrode
   1b drain electrode
   1c source electrode
2 load
3 radio frequency network
4 gate bias network
5 device having non-linear characteristic
6 gate bias-T
7 drain bias-T
8 drain bias network
9 power amplifier
10 feedback circuit/filter
11 gate DC supply
12 drain DC supply
13 RF block
14 DC block

The invention claimed is:

1. A bias network for field effect transistors comprising:
a field effect transistor, the field effect transistor having an internal gate-diode, a source electrode connected to ground and a drain electrode connected to a load;
a radio frequency network connected to the gate electrode of the field effect transistor;
a gate bias network connected to the gate electrode of the field effect transistor; and
a device having a non-linear characteristic provided in series between the gate electrode of the field effect transistor and the gate bias network, the radio frequency network and the gate bias network are connected to the gate electrode of the field effect transistor via a gate bias-T device comprising a capacitor and wherein the device having non-linear characteristic is provided between the gate bias-T device and the gate bias network, and further wherein the device having a non-liner characteristic is arranged such that a negative current passes through the device but a positive current is blocked or reduced.

2. The bias network for field effect transistors according to claim 1, wherein the gate bias network provides a negative DC voltage to the gate electrode of the field effect transistor.

3. The bias network for field effect transistors according to claim 1, wherein the device having a non-linear characteristic comprises a diode or a transistor or a network having the characteristic of a diode.

4. The bias network for field effect transistors according to claim 1, wherein the field effect transistor is a HEMT transistor.

5. The bias network for field effect transistors according to claim 4, wherein the field effect transistor is a GaN HEMT transistor.

6. The bias network for field effect transistors according to claim 1, wherein a second bias-T device is provided between the drain electrode and the load as well as between the drain electrode and a drain bias network.

7. The bias network for field effect transistors according to claim 1, wherein the radio frequency network inputs the output signal of a power amplifier to the field effect transistor.

8. The bias network for field effect transistors according to claim 1, wherein the radio frequency network inputs the output signal of a feedback network to establish an oscillator network.

9. The bias network for field effect transistors according to claim 1, wherein the device is realized as a diode and a zener diode is connected to a point between the diode and the gate bias-T such that the DC voltage is limited in the negative direction.

10. A method for self-adjustment of a bias point of a field effect transistor in RF applications, comprising the steps of:
providing a negative DC voltage by a gate bias network via a gate bias-T device comprising a capacitor to a gate electrode of a field effect transistor having an internal gate diode, and providing an additional RF signal by a RF network via the gate bias-T device to the gate electrode such that a negative current flows towards the gate of the field effect transistor;
increasing the RF signal of the RF network, whereupon the gate current increases to become positive; and
self-adjusting the bias point of the field-effect transistor by blocking or limiting a positive current at the gate electrode using a device having non-linear characteristics provided between the gate bias-T device and the gate bias network, wherein the device having a non-liner characteristic is arranged such that a negative current passes through the device but a positive current is blocked or reduced.

11. The method for self-adjustment of a bias point of a field effect transistor in RF applications of claim 10, wherein an oscillator feedback-circuit is connected to the gate electrode of the transistor.

12. The method for self-adjustment of a bias point of a field effect transistor in RF applications of claim 10, further comprising the step of:
limiting the maximum negative value of the self-adjustment of the bias point by providing a zener diode between the device with non-linear characteristics and the gate electrode.

* * * * *